US012581771B2

(12) United States Patent
Tsuchiya et al.

(10) Patent No.: US 12,581,771 B2
(45) Date of Patent: Mar. 17, 2026

(54) METHOD FOR MANUFACTURING EPITAXIAL WAFER FOR ULTRAVIOLET RAY EMISSION DEVICE, METHOD FOR MANUFACTURING SUBSTRATE FOR ULTRA VIOLET RAY EMISSION DEVICE, EPITAXIAL WAFER FOR ULTRAVIOLET RAY EMISSION DEVICE, AND SUBSTRATE FOR ULTRAVIOLET RAY EMISSION DEVICE

(71) Applicant: SHIN-ETSU HANDOTAI CO., LTD., Tokyo (JP)

(72) Inventors: Keitaro Tsuchiya, Takasaki (JP); Masato Yamada, Chiyoda-ku (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 343 days.

(21) Appl. No.: 18/279,579

(22) PCT Filed: Feb. 16, 2022

(86) PCT No.: PCT/JP2022/006033
§ 371 (c)(1),
(2) Date: Aug. 30, 2023

(87) PCT Pub. No.: WO2022/185906
PCT Pub. Date: Sep. 9, 2022

(65) Prior Publication Data
US 2024/0136466 A1 Apr. 25, 2024
US 2024/0234623 A9 Jul. 11, 2024

(30) Foreign Application Priority Data

Mar. 4, 2021 (JP) ................................. 2021-034203

(51) Int. Cl.
H10H 20/01 (2025.01)
H10H 20/812 (2025.01)
H10H 20/825 (2025.01)

(52) U.S. Cl.
CPC ...... *H10H 20/0137* (2025.01); *H10H 20/018* (2025.01); *H10H 20/812* (2025.01); *H10H 20/825* (2025.01)

(58) Field of Classification Search
CPC .................................................. H10H 20/0137
See application file for complete search history.

(56) References Cited

U.S. PATENT DOCUMENTS 6,559,075 B1 5/2003 Kelly et al.
2010/0127353 A1 5/2010 Letertre et al.
(Continued)

FOREIGN PATENT DOCUMENTS

JP 2001-501778 A 2/2001
JP 2006066556 A 3/2006
(Continued)

OTHER PUBLICATIONS

English translation of International Preliminary Report on Patentability mailed Sep. 14, 2023, in corresponding International Application No. PCT/JP2022/006033.
(Continued)

*Primary Examiner* — Douglas M Menz
(74) *Attorney, Agent, or Firm* — Harness, Dickey & Pierce, P.L.C.

(57) ABSTRACT

The present invention is a method for manufacturing an epitaxial wafer for an ultraviolet ray emission device, the method including steps of: preparing a supporting substrate having at least one surface composed of gallium nitride; forming a bonding layer on the surface composed of the gallium nitride of the supporting substrate; forming a lami-
(Continued)

nated substrate having a seed crystal layer by laminating a seed crystal composed of an $Al_xGa_{1-x}N$ (0.5<x≤1.0) single crystal to the bonding layer; and epitaxially growing an ultraviolet emission device layer on the seed crystal layer of the laminated substrate, the ultraviolet emission device layer having at least: a first conductive clad layer composed of $Al_yGa_{1-y}N$ (0.5<y≤1.0); an AlGaN-based active layer; and a second conductive clad layer composed of $Al_zGa_{1-z}N$ (0.5<z≤1.0). This provides a method for manufacturing an inexpensive, high-quality epitaxial wafer for an ultraviolet ray emission device.

17 Claims, 2 Drawing Sheets

(56)                References Cited

U.S. PATENT DOCUMENTS

| | | | |
|---|---|---|---|
| 2013/0040437 A1 | 2/2013 | Maeda et al. | |
| 2013/0244364 A1 | 9/2013 | Gardner et al. | |
| 2013/0323906 A1 | 12/2013 | Kim et al. | |
| 2014/0103358 A1 | 4/2014 | Maeda et al. | |
| 2016/0372628 A1* | 12/2016 | Henley | H01L 21/02002 |
| 2018/0019169 A1 | 1/2018 | Henley | |
| 2020/0075796 A1 | 3/2020 | Koyanagi | |
| 2021/0391502 A1* | 12/2021 | Watanabe | H10H 20/816 |

FOREIGN PATENT DOCUMENTS

| | | | |
|---|---|---|---|
| JP | 2006-210660 A | 8/2006 | |
| JP | 2011-233861 A | 11/2011 | |
| JP | 2011-243968 A | 12/2011 | |
| JP | 2013-542608 A | 11/2013 | |
| JP | 2013-247362 A | 12/2013 | |
| JP | 2019-527477 A | 9/2019 | |
| JP | 2020-035829 A | 3/2020 | |
| JP | 2020-100528 A | 7/2020 | |
| TW | I643360 B | 12/2018 | |
| WO | 2011/132654 A1 | 10/2011 | |
| WO | 2016/007582 A1 | 1/2016 | |
| WO | 2021/250991 A1 | 12/2021 | |
| WO | 2022/070699 A1 | 4/2022 | |

OTHER PUBLICATIONS

International Search Report mailed May 10, 2022, in corresponding International Application No. PCT/JP2022/006033 (with English translation).

Kawasaki, et al.; Deep Ultraviolet Nitride Light Emitting Devices; Kogaku 246-2, 8 pages; published May 2006 (including English abstract).

Notification of Resasons for Refusal mailed Jan. 4, 2024, in corresponding Japanese Application No. 2021-034203 (with English translation).

Extended European Search Reporting application No. 22762963.1 issued on Sep. 3, 2025.

Taiwanese Office Action and Search Report in application No. 111106275 issued on Oct. 3, 2025.

* cited by examiner

[FIG. 1]

| Preparing a supporting substrate (S1) |
|---|

| Forming a bonding layer (S2) |
|---|

| Forming a laminated substrate (S3) |
|---|

| Growing an epitaxial layer on a seed crystal layer by an HVPE method (S4) |
|---|

| Growing a homoepitaxial layer (S5) |
|---|

| Epitaxially growing an ultraviolet emission device layer (S6) |
|---|

| Bonding a permanent supporting substrate (S7) / Growing an epitaxial layer by an HVPE method (S8) |
|---|

| Separating the supporting substrate (S9) |
|---|

[FIG. 2]

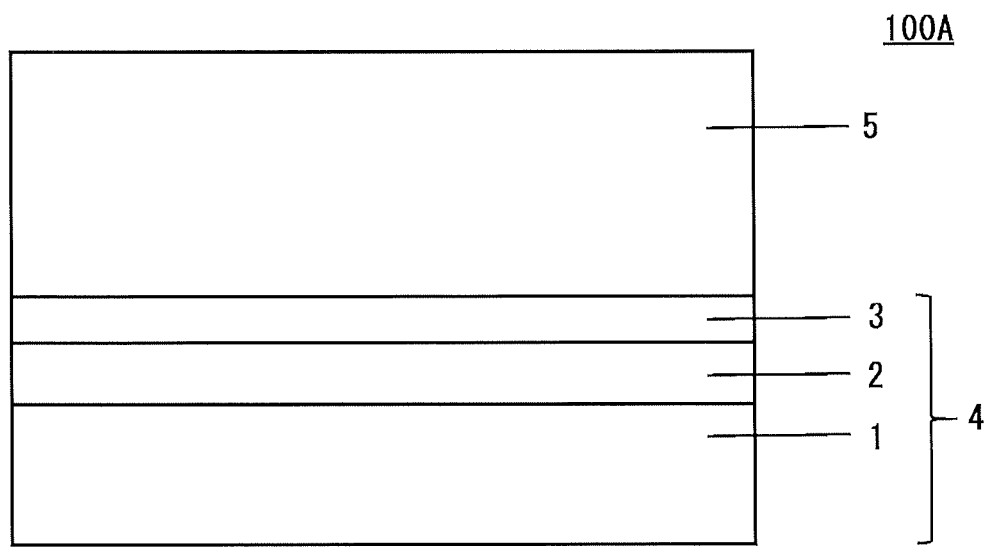

[FIG. 3]
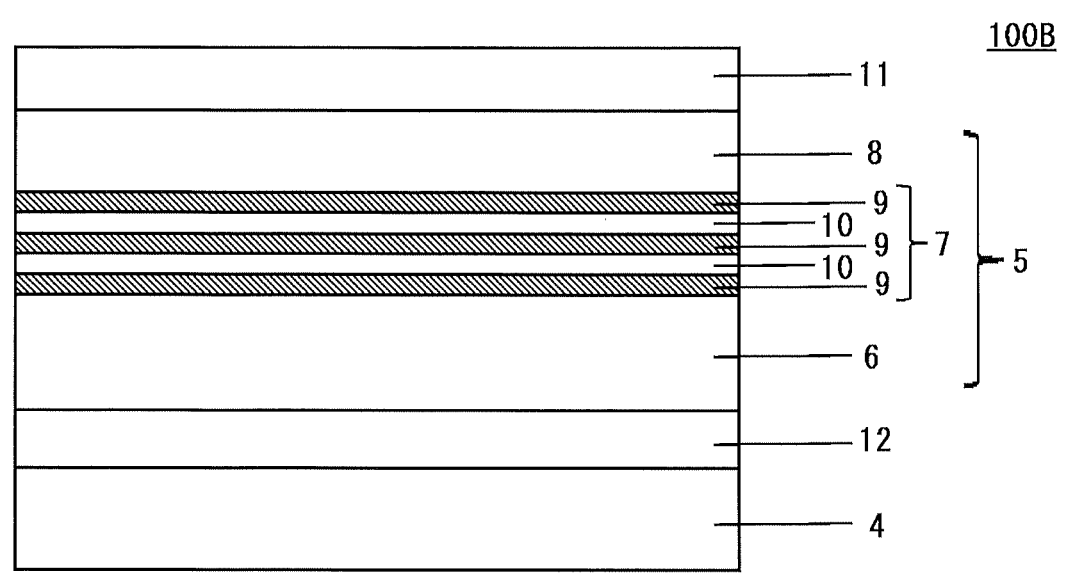

METHOD FOR MANUFACTURING EPITAXIAL WAFER FOR ULTRAVIOLET RAY EMISSION DEVICE, METHOD FOR MANUFACTURING SUBSTRATE FOR ULTRA VIOLET RAY EMISSION DEVICE, EPITAXIAL WAFER FOR ULTRAVIOLET RAY EMISSION DEVICE, AND SUBSTRATE FOR ULTRAVIOLET RAY EMISSION DEVICE

CROSS-REFERENCE TO RELATED APPLICATIONS

This application is a 371 U.S. National Phase of International Application No. PCT/JP2022/006033, filed Feb. 16, 2022, which claims priority to Japanese Application No. 2021-034203, filed Mar. 4, 2021. The entire disclosures of the above applications are incorporated herein by reference.

TECHNICAL FIELD

The present invention relates to a method for manufacturing an epitaxial wafer for an ultraviolet ray emission device, a method for manufacturing a substrate for an ultraviolet ray emission device, an epitaxial wafer for an ultraviolet ray emission device, and a substrate for an ultraviolet ray emission device.

BACKGROUND ART

A light-emitting diode for deep ultraviolet ray utilizing a nitride semiconductor material has been expected to enlarge its market in recent years as a light source for sterilization from the viewpoints of mercury-free, long lifetime, size reduction, weight reduction, energy saving, etc.

CITATION LIST

Patent Literature

Patent Document 1: JP 2020-100528 A
Patent Document 2: JP 2020-35829 A

Non Patent Literature

Non Patent Document 1: KOGAKU 246 (2) "Deep Ultraviolet Nitride Light Emitting Devices". Koji Kawasaki

SUMMARY OF INVENTION

Technical Problem

However, epitaxial substrates for these light-emitting diodes for deep ultraviolet ray are formed on a material substrate having different lattice constants, such as sapphire and SiC. In this case, a defect due to lattice mismatch occurs, which tends to drop internal quantum efficiency to lower energy conversion efficiency. In a case of a wavelength shorter than 250 nm, this effect becomes further considerable. Furthermore, a GaN single crystal free-standing substrate having a relatively close lattice constant becomes a light-absorbing substrate to lower external quantum efficiency due to its bandgap. Although an AlN single crystal free-standing substrate is promising as an extremely high-quality substrate for epitaxial, it is difficult to manufacture the substrate, and the substrate is an extremely expensive material. Thus, the spread of the deep-ultraviolet-emitting diode for sterilization with high output and high efficiency is problematic.

To produce an inexpensive and high-quality light-emitting diode for deep ultraviolet, Patent Document 1 discloses a substrate in which an AlN seed crystal is laminated onto a substrate made of ceramic, and the light-emitting diode for deep ultraviolet can be produced on such a substrate. However, it is difficult to lift-off the ceramic substrate, and there is a problem of an increased cost including its device process.

Patent Document 2 discloses a laser lift-off technique with an LED using GaN, but this method has a major premise of growth to a substrate having larger bandgap than a grown epitaxial layer, that is growth to a transparent free-standing substrate such as sapphire, and there is a problem of limitation to a sapphire substrate having poor epitaxial crystallinity or expensive substrates such as expensive AlN.

Non Patent Document 1 discloses a method comprising: epitaxially growing GaN on a sapphire substrate; forming an ultraviolet-emitting diode thereon; and performing a laser lift-off. However, producing the GaN layer and the ultraviolet-emitting diode with the epitaxial growth generates threading dislocation derived from a difference in lattice constant and a difference in thermal expansion coefficient to cause a problem of lowering light emission efficiency.

The present invention has been made to solve the above problems, and an object of the present invention is to provide: an inexpensive and high-quality epitaxial wafer for an ultraviolet ray emission device that is particularly suitable for a deep ultraviolet ray region (UVC; 200 to 290 nm); and a method for manufacturing the same.

Solution to Problem

The present invention has been made to achieve the above object, and provides a method for manufacturing an epitaxial wafer for an ultraviolet ray emission device, the method comprising steps of: preparing a supporting substrate having at least one surface composed of gallium nitride; forming a bonding layer on the surface composed of the gallium nitride of the supporting substrate; forming a laminated substrate having a seed crystal layer by laminating a seed crystal composed of an $Al_xGa_{1-x}N$ ($0.5 < x \leq 1.0$) single crystal to the bonding layer; and epitaxially growing an ultraviolet emission device layer on the seed crystal layer of the laminated substrate, the ultraviolet emission device layer having at least: a first conductive clad layer composed of $Al_yGa_{1-y}N$ ($0.5 < y \leq 1.0$); an AlGaN-based active layer; and a second conductive clad layer composed of $Al_zGa_{1-z}N$ ($0.5 < z \leq 1.0$).

According to such a method for manufacturing an epitaxial wafer for an ultraviolet ray emission device, a high-quality epitaxial wafer with low dislocation density can be obtained by a simple epitaxial growth at a low cost, and productivity of the epitaxial process can be improved.

In this case, the method can be the method for manufacturing an epitaxial wafer for an ultraviolet ray emission device wherein, in forming the laminated substrate, the seed crystal layer is formed by: implanting ions into an $Al_xGa_{1-x}N$ ($0.5 < x \leq 1.0$) single crystal free-standing substrate or into an $Al_xGa_{1-x}N$ ($0.5 < x \leq 1.0$) epitaxial substrate to form a fragile layer inside the free-standing substrate or the epitaxial substrate; then laminating the free-standing substrate or the epitaxial substrate to the supporting substrate; and removing the free-standing substrate or the epitaxial substrate with the fragile layer.

Implanting ions as such can laminate a thin seed crystal layer relatively easily. The removed $Al_xGa_{1-x}N$ (0.5<x≤1.0) single crystal free-standing substrate or epitaxial substrate when forming the seed crystal layer enables to reuse the expensive compound semiconductor single crystal substrate by recovering and repolishing, which can contribute to cost reduction.

In this case, the method can be the method for manufacturing an epitaxial wafer for an ultraviolet ray emission device further comprising, before growing the first conductive clad layer, growing an epitaxial layer on the seed crystal layer by an HVPE method.

This method thickens the epitaxial layer and can thicken an entirety of the epitaxial wafer for an ultraviolet ray emission device, and facilitates handling even when the supporting substrate is removed.

In this case, the method can be the method for manufacturing an epitaxial wafer for an ultraviolet ray emission device further comprising: bonding a permanent supporting substrate onto a side of the ultraviolet emission device layer, the permanent supporting substrate being transparent to ultraviolet ray; or growing an epitaxial layer on a side of the ultraviolet emission device layer by an HVPE method.

This method can thicken an entirety of the epitaxial wafer for an ultraviolet ray emission device, and facilitates handling.

In this case, the method can be a method for manufacturing a substrate for an ultraviolet ray emission device, the method comprising a step of removing the supporting substrate to obtain a substrate for an ultraviolet ray emission device by irradiating the epitaxial wafer for an ultraviolet ray emission device obtained by the above method for manufacturing an epitaxial wafer for an ultraviolet ray emission device with laser light to be absorbed by gallium nitride from a side of the ultraviolet emission device layer.

This method, which can remove the supporting substrate with utilizing laser lift-off, can reduce a cost of the device process. In addition, since the expensive compound semiconductor single crystal substrate can be reused by recovering and repolishing the supporting substrate, the epitaxial substrate for a light-emitting diode for a deep ultraviolet ray region can be inexpensively manufactured. The separated supporting substrate is reusable, and thereby further cost reduction can be achieved.

The present invention has been made to achieve the above object, and provides an epitaxial wafer for an ultraviolet ray emission device, comprising: a laminated substrate having: a supporting substrate having at least one surface composed of gallium nitride; a bonding layer on the surface composed of the gallium nitride of the supporting substrate; and a seed crystal layer composed of an $Al_xGa_{1-x}N$ (0.5<x≤1.0) single crystal on the bonding layer; and an ultraviolet emission device layer on the seed crystal layer of the laminated substrate, the ultraviolet emission device layer having at least: a first conductive clad layer composed of $Al_yGa_{1-y}N$ (0.5<y≤1.0); an AlGaN-based active layer; and a second conductive clad layer composed of $Al_zGa_{1-x}N$ (0.5<z≤1.0).

Such an epitaxial wafer for an ultraviolet ray emission device is a high-quality and inexpensive epitaxial wafer with low dislocation density. With such an epitaxial wafer for an ultraviolet ray emission device, the supporting substrate can be easily separated from the seed crystal layer and the epitaxial layer on the seed crystal layer by irradiating with laser to be absorbed by gallium nitride from a side of the epitaxial layer. Thus, the supporting substrate can be reused, which is economical.

In this case, the wafer can be an epitaxial wafer for an ultraviolet ray emission device wherein the supporting substrate is composed of any one of a GaN free-standing substrate, a sapphire substrate having a GaN layer, an SiC substrate having a GaN layer, a Si substrate having a GaN layer, and an engineering substrate having a surface made of a material composed of a GaN single crystal.

In this case, the wafer can be an epitaxial wafer for an ultraviolet ray emission device wherein the seed crystal layer has a light transmittance of light having a wavelength of 230 nm of 70% or more.

This can provide a deep-ultraviolet-ray-emitting device with high emitting efficiency.

In this case, the wafer can be an epitaxial wafer for an ultraviolet ray emission device wherein the AlGaN-based active layer has a multiple quantum well (MQW) structure, contains In as a constituting element other than Al, Ga, and N, and has a proportion of the In of less than 1%.

The wafer can be an epitaxial wafer for an ultraviolet ray emission device wherein the AlGaN-based active layer has $\lambda_p$ being a wavelength shorter than 290 nm, the $\lambda_p$ being in an emission spectrum with current injection at 25° C. and 0.2 $A/mm^2$.

This can provide a deep-ultraviolet-ray-emitting device with high quality as a light source for sterilization.

In this case, the wafer can be an epitaxial wafer for an ultraviolet ray emission device further comprising a permanent supporting substrate on a side of the ultraviolet emission device layer, the permanent supporting substrate being transparent to ultraviolet ray.

This can thicken the epitaxial wafer, and facilitates handling.

In this case, a substrate for an ultraviolet ray emission device wherein the supporting substrate in the above epitaxial wafer for an ultraviolet ray emission device is separated and removed can be provided.

This substrate enables the separated and removed supporting substrate to be reused, and provides an inexpensive substrate that can further contribute to the cost reduction.

Advantageous Effects of Invention

As noted above, the inventive method for manufacturing an epitaxial wafer for an ultraviolet ray emission device can yield the high-quality epitaxial wafer for an ultraviolet ray emission device with a low cost. The inventive epitaxial wafer for an ultraviolet ray emission device is inexpensive with high quality.

BRIEF DESCRIPTION OF DRAWINGS

FIG. 1 illustrates an outline flowchart of the method for manufacturing an epitaxial wafer for an ultraviolet ray emission device according to the present invention.

FIG. 2 illustrates an example of the epitaxial wafer for an ultraviolet ray emission device according to the present invention.

FIG. 3 illustrates another example of the epitaxial wafer for an ultraviolet ray emission device according to the present invention.

DESCRIPTION OF EMBODIMENTS

Hereinafter, the present invention will be described in detail, but the present invention is not limited thereto.

As noted above, the inexpensive and high-quality epitaxial wafer for an ultraviolet ray emission device that is suitable for a light-emitting diode for a deep ultraviolet ray region (UVC; 200 to 290 nm) and the method for manufacturing the same have been required.

The present inventors have earnestly studied the above problem, and consequently found that the high-quality epitaxial wafer for an ultraviolet ray emission device can be obtained by a method for manufacturing an epitaxial wafer for an ultraviolet ray emission device at a low cost. The method comprises steps of: preparing a supporting substrate having at least one surface composed of gallium nitride; forming a bonding layer on the surface composed of the gallium nitride of the supporting substrate; forming a laminated substrate having a seed crystal layer by laminating a seed crystal composed of an $Al_xGa_{1-x}N$ ($0.5<x\leq1.0$) single crystal to the bonding layer; and epitaxially growing an ultraviolet emission device layer on the seed crystal layer of the laminated substrate, the ultraviolet emission device layer having at least: a first conductive clad layer composed of $Al_yGa_{1-y}N$ ($0.5<y\leq1.0$); an AlGaN-based active layer; and a second conductive clad layer composed of $Al_zGa_{1-z}N$ ($0.5<z\leq1.0$). This finding has led to complete the present invention.

The present inventors have earnestly studied the above problem, and consequently found that an epitaxial wafer for an ultraviolet ray emission device can be the inexpensive and high-quality epitaxial wafer for an ultraviolet ray emission device. The epitaxial wafer for an ultraviolet ray emission device comprises: a laminated substrate having: a supporting substrate having at least one surface composed of gallium nitride; a bonding layer on the surface composed of the gallium nitride of the supporting substrate; and a seed crystal layer composed of an $Al_xGa_{1-x}N$ ($0.5<x\leq1.0$) single crystal on the bonding layer; and an ultraviolet emission device layer on the seed crystal layer of the laminated substrate, the ultraviolet emission device layer having at least: a first conductive clad layer composed of $Al_yGa_{1-y}N$ ($0.5<y\leq1.0$); an AlGaN-based active layer; and a second conductive clad layer composed of $Al_zGa_{1-z}N$ ($0.5<z\leq1.0$). This finding has led to complete the present invention.

Hereinafter, the description will be made with reference to the drawings.

Epitaxial Wafer for Ultraviolet Ray Emission Device

FIGS. 2 and 3 illustrate an example of the epitaxial wafer for an ultraviolet ray emission device according to the present invention. As illustrated in FIG. 2, an epitaxial wafer 100 A for an ultraviolet ray emission device according to the present invention comprises a laminated substrate 4 having: a supporting substrate 1 having at least one surface composed of gallium nitride; a bonding layer 2 on the surface composed of the gallium nitride of the supporting substrate 1; and a seed crystal layer 3 composed of an $Al_xGa_{1-x}N$ ($0.5<x\leq1.0$) single crystal on the bonding layer 2; and an ultraviolet emission device layer 5 on the seed crystal layer 3 of the laminated substrate 4. In the example in FIG. 2, a detail of the ultraviolet emission device layer 5 is omitted. The ultraviolet emission device layer 5 has, as illustrated in FIG. 3, at least: a first conductive clad layer 6 composed of $Al_yGa_{1-y}N$ ($0.5<y\leq1.0$); an AlGaN-based active layer 7; and a second conductive clad layer 8 composed of $Al_zGa_{1-z}N$ ($0.5<z\leq1.0$).

As described later, the supporting substrate 1 is separated and removed to be the substrate for an ultraviolet ray emission device according to the present invention. The separated and removed supporting substrate 1 is reusable, which thereby can contribute to further cost reduction.

First, the laminated substrate 4 will be described. The supporting substrate 1 is not particularly limited as long as it has at least one surface composed of gallium nitride. Specifically, a usable substrate has heat resistance not to cause melting, removing, nor breaking in a treatment at a high temperature exceeding 1000° C. For example, a gallium nitride single crystal free-standing substrate, a GaN-on-sapphire substrate, a GaN-on-SiC substrate, a GaN-on-Si substrate, and an engineering substrate in which a material mainly composed of GaN is laminated to ceramic can be used.

The bonding layer 2 is a layer to bond between the supporting substrate 1 and the seed crystal layer 3. For example, usable as the bonding layer 2 is an amorphous layer obtained by activating a transparent bonding layer, such as $SiO_2$, and GaN on a surface of the supporting substrate with plasma etching or argon-ion etching. In this case, the amorphous layer obtained by activation with plasma or argon-ion etching may be provided also on an AlGaN surface on a side of the seed crystal layer 3. The seed crystal layer 3 is a layer composed of an $Al_xGa_{1-x}N$ ($0.5<x\leq1.0$) single crystal.

The seed crystal layer preferably has a light transmittance of light having a wavelength of 230 nm of 70% or more. Such a seed crystal layer can yield a deep-ultraviolet-ray-emitting device with high emission efficiency.

Next, constitution of the ultraviolet emission device layer 5 will be described in detail with reference to FIG. 3. In the example of an epitaxial wafer 100B for an ultraviolet ray emission device in FIG. 3, a detail of the laminated substrate 4 is omitted. The ultraviolet emission device layer 5 has at least: a first conductive clad layer 6 composed of $Al_yGa_{1-y}N$ ($0.5<y\leq1.0$); an AlGaN-based active layer 7; and a second conductive clad layer 8 composed of $Al_zGa_{1-z}N$ ($0.5<z\leq1.0$).

The first conductive clad layer 6 is to supply electrons to the AlGaN-based active layer 7. A film thickness thereof is not particularly limited, and may be 2.5 µm, for example. The AlGaN-based active layer 7 is not particularly limited, but preferably has a multiple quantum well structure (MQW) in which well layers 9 and barrier layers 10 are alternately stacked, for example. The second conductive clad layer 8 is to supply holes to the AlGaN-based active layer 7.

The AlGaN-based active layer preferably has the multiple quantum well (MQW) structure, contains In as a constituting element other than Al, Ga, and N, and has a proportion of the In of less than 1%. The AlGaN-based active layer preferably has $\lambda_p$ being a wavelength shorter than 290 nm, the $\lambda_p$ being in an emission spectrum with current injection at 25° C. and 0.2 A/mm². Such an AlGaN-based active layer yields a deep-ultraviolet-ray-emitting device with high quality as a light source for sterilization.

Furthermore, to reduce contacting resistance with the electrode, a contacting layer 11 composed of p-type AlGaN can be provided. In this case, the layer arrangement may be inversed P/N according to the conductive type of the second conductive clad layer 8.

On the seed crystal layer 3 of the laminated substrate 4, a thick epitaxial layer may be provided. Instead of this thick epitaxial layer, a thick epitaxial layer or a permanent supporting substrate transparent to ultraviolet ray may be provided on the ultraviolet emission device layer 5. When the thick epitaxial layer or the permanent supporting substrate is provided as above, a certain thickness can be made as the epitaxial wafer for an ultraviolet ray emission device, and thereby facilitates handling even when the supporting substrate 1 is separated and removed.

A homoepitaxial layer 12 may be provided on the laminated substrate 4. The homoepitaxial layer 12 is to improve crystal quality, and may be set within a range of 100 nm to 300 μm, for example. The homoepitaxial layer 12 can be omitted depending on the device design.

Substrate For Ultraviolet Ray Emission Device The supporting substrate is separated and removed from the epitaxial wafer for an ultraviolet ray emission device according to the present invention to be the substrate for an ultraviolet ray emission device according to the present invention.

Method for Manufacturing Epitaxial Wafer for Ultraviolet Ray Emission Device

FIG. 1 illustrates an outline flowchart of the method for manufacturing the epitaxial wafer for an ultraviolet ray emission device and substrate for an ultraviolet ray emission device according to the present invention.

(Formation of Laminated Substrate)

First, the supporting substrate having at least one surface composed of gallium nitride is prepared (S1). Then, the bonding layer is formed on the surface composed of gallium nitride of the supporting substrate (S2). A method for forming the bonding layer is not particularly limited, and examples thereof include a method for film-forming a transparent bonding layer such as $SiO_2$. Alternatively, examples thereof include a method for forming an amorphous layer by activating the GaN surface with plasma or argon-ion etching. In this case, an amorphous layer is preferably formed also on a surface of AlGaN on a side of the seed crystal layer.

A seed crystal composed of an $Al_xGa_{1-x}N$ ($0.5<x\leq1.0$) single crystal is laminated onto the bonding layer to form a laminated substrate having the seed crystal layer (S3). The laminated substrate is produced by laminating the supporting substrate on which the bonding layer is formed to the seed crystal. In this time, the bonding can be achieved by a pressurizing or heating method, for example.

The seed crystal layer composed of the $Al_xGa_{1-x}N$ ($0.5<x\leq1.0$) single crystal can be produced by implanting ions into an $Al_xGa_{1-x}N$ ($0.5<x\leq1.0$) single crystal freestanding substrate or into an $Al_xGa_{1-x}N$ epitaxial substrate to form a fragile layer, and removing the single crystal freestanding substrate or the epitaxial substrate after laminating to the supporting substrate, but the method is not limited thereto. This method can yield the laminated substrate having: the supporting substrate having at least one surface composed of gallium nitride; the bonding layer on the surface composed of gallium nitride of the supporting substrate; and the seed crystal layer composed of the $Al_xGa_{1-x}N$ ($0.5<x\leq1.0$) single crystal on the bonding layer.

(Introduction into Reaction Furnace)

The laminated substrate is introduced into a reaction furnace of an MOVPE apparatus. Before the laminated substrate is introduced into the reaction furnace, cleaning is preferably performed with a chemical reagent. After the laminated substrate is introduced into the reaction furnace, the furnace inside is filled with a highly pure inert gas, such as nitrogen, to eject gas in the furnace.

(Cleaning of Laminated Substrate Surface)

First, the laminated substrate is preferably heated in the reaction furnace to clean the substrate surface. A temperature for the cleaning can be between 1000° C. and 1200° C. as a temperature of the laminated substrate surface, and specifically, cleaning at 1050° C. can yield a clean surface. The cleaning is preferably performed after reducing the pressure in the furnace, and the pressure in the furnace may be between 30 mbar ($30\times10^2$ Pa) and 200 mbar ($200\times10^2$ Pa). The cleaning is performed for approximately 10 minutes in a state where a mixed gas composed of hydrogen, nitrogen, ammonia, etc. is suppled into the reaction furnace. These conditions are an example, and the condition is not particularly limited.

(Growth of Thick Epitaxial Layer)

On the seed crystal layer, the thick epitaxial layer may be grown by an HVPE method before growing the first conductive clad layer (S4).

(Growth of Homoepitaxial Layer)

Forming the homoepitaxial layer (S5) before growing the first conductive clad layer is also preferable. In this step, gases to be Al, Ga, and N sources, which are raw materials, are introduced at a predetermined pressure in the furnace and substrate temperature to epitaxially grow $Al_xGa_{1-x}N$ ($0.5<x\leq1.0$) on the laminated substrate. In this step, the growth can be performed at a pressure in the furnace of 50 mbar ($50\times10^2$ Pa) at a substrate temperature of 1120° C., for example. As the Al source, trimethylaluminum (TMAl) can be used. As the Ga source, trimethylgallium (TMGa) can be used. As the N source, ammonia ($NH_3$) can be used. To obtain a mixed crystal having a desired Al composition, flow rates of the raw materials TMAl and TMGa are set so that a ratio of Al and Ga to be incorporated into the thin film becomes a set ratio with considering material efficiency of the raw material gasses. For a carrier gas of TMAl, TMGa, and $NH_3$, hydrogen can be use, for example. These conditions are an example, and the condition is not particularly limited.

(Growth of Ultraviolet Emission Device Layer)

Then, the ultraviolet emission device layer is grown by epitaxial growth on the seed crystal layer (on the homoepitaxial layer when the homoepitaxial layer is formed) (S6). For example, the ultraviolet emission device layer can be formed as follows.

(Growth of First Conductive Clad Layer)

This step is a step of growing the first conductive clad layer on the seed crystal layer. In this step, predetermined pressure in the furnace and substrate temperature are held, and then TMAl, TMGa, and $NH_3$, which are the raw materials, and an impurity gas to form n-type conductivity are supplied into the furnace to grow the first conductive clad layer. The first conductive clad layer can be freely produced with the composition represented by $Al_yGa_{1-y}N$ ($0.5<y\leq1.0$).

In this step, the predetermined pressure in the furnace can be set to 75 mbar ($75\times10^2$ Pa), and the substrate temperature can be set to 1100° C., for example. To obtain a mixed crystal having a desired Al composition, flow rates of the raw materials TMAl and TMGa are set so that a ratio of Al and Ga to be incorporated into the thin film becomes a set ratio with considering material efficiency of the raw material gasses.

As the impurity gas to form n-type conductivity, monosilane ($SiH_4$) can be used. As a carrier gas to carry the raw material gases, hydrogen can be used. Tetraethylsilane may also be used as the impurity gas.

(Growth of AlGaN-based Active Layer)

This step is a step of growing the AlGaN-based active layer on the first conductive clad layer. In this step, predetermined pressure in the reaction furnace and substrate temperature are held, and then TMAl, TMGa, and $NH_3$, which are the raw materials, are supplied into the furnace to grow the AlGaN-based active layer. As an example, the AlGaN-based active layer can be barrier layers $Al_{0.75}Ga_{0.25}N$ and well layers $Al_{0.6}Ga_{0.4}N$. In this step, predetermined pressure in the furnace can be set to 75 mbar ($75\times10^2$ Pa), and the substrate temperature can be set to 1100° C., for example. To obtain a mixed crystal having a desired Al composition in each layer, flow rates of the raw materials TMAl and TMGa are set so that a ratio of Al and Ga to be incorporated into the thin film becomes a set ratio with considering material efficiency of the raw material gasses. These values are an example, and the values are not particularly limited.

(Growth of Second Conductive Clad Layer)

This step is a step of growing the second conductive clad layer on the AlGaN-based active layer. In this step, predetermined pressure in the reaction furnace and substrate temperature are held, and then TMAl, TMGa, and $NH_3$, which are the raw materials, and an impurity raw material to form p-type conductivity are supplied into the furnace to grow the second conductive clad layer. The second conductive clad layer can be freely produced with the composition represented by $Al_zGa_{1-x}N$ (0.5<z≤1.0). A plurality of layers having changed compositions may be formed.

In this step, the predetermined pressure in the furnace can be set to 75 mbar ($75×10^2$ Pa), and the substrate temperature can be set to 1100° C., for example. To obtain a mixed crystal having a desired Al composition, flow rates of the raw materials TMAl and TMGa are set so that a ratio of Al and Ga to be incorporated into the thin film becomes a set ratio with considering material efficiency of the raw material gasses. These values are an example, and the values are not particularly limited. As the impurity raw material for forming p-type conductivity, biscyclopentadienylmagnesium ($Cp_2Mg$) can be used. A carrier gas to carry the raw material gasses can be hydrogen.

(Growth of p-Type AlGaN Contacting Layer)

This step is a step of growing the p-type AlGaN contacting layer on the second conductive clad layer. In this step, predetermined pressure in the reaction furnace and substrate temperature are held, and then TMAl, TMGa, and $NH_3$, which are the raw materials, and the impurity raw material to form p-type conductivity are supplied into the furnace to grow the p-type AlGaN contacting layer. In this step, the predetermined pressure in the furnace can be set to 75 mbar ($75×10^2$ Pa), and the substrate temperature can be set to 1100° C., for example. These values are an example, and the values are not particularly limited. As the impurity raw material for forming p-type conductivity, biscyclopentadienylmagnesium ($Cp_2Mg$) can be used. A carrier gas to carry the raw material gasses can be hydrogen.

(Step of Activating Annealing)

In this step, the wafer is annealed at predetermined temperature and time in a heating furnace to activate the p-type impurity in the second conductive clad layer and p-type AlGaN contacting layer. The activation in the heating furnace can be performed at 750° C. for 10 minutes, for example.

(Formation of Thick Epitaxial Layer, etc.)

On the ultraviolet emission device layer, the permanent supporting substrate that is transparent to ultraviolet ray may be bonded (S7). The thick epitaxial layer may be grown by an HVPE method (S8).

(Removal of Epitaxial Layer with Laser)

To produce the substrate for an ultraviolet ray emission device such as a deep-ultraviolet-emitting diode, for example, irradiating with laser light that penetrates the epitaxial layer and the seed crystal and that is absorbed by GaN from a side of the second conductive clad layer (side of the ultraviolet emission device layer) separates the supporting substrate from the seed crystal layer and the epitaxial layer on the seed crystal (S9). The laser light irradiation is absorbed by gallium nitride on the surface of the supporting substrate, and the supporting substrate is removed and separated by generated heat.

(Regeneration of Seed Substrate and Supporting Substrate)

In producing the laminated substrate (S3), the seed crystal composed of the $Al_xGa_{1-x}N$ (0.5<x≤1.0) single crystal is laminated, and a remained single crystal by removing the seed crystal layer and removed supporting substrate can be regenerated to use, which enables to reuse the expensive compound semiconductor substrate. Therefore, the cost can be reduced.

The manufacturing method according to the present invention, which produces the epitaxial wafer for an ultraviolet ray emission device and substrate for an ultraviolet ray emission device particularly suitable for a light-emitting diode for a deep-ultraviolet region, can yield the high-quality substrate with low dislocation density by the simple epitaxial growth, and can improve the productivity of the epitaxial process. Since the substrate can be removed by utilizing the laser lift-off, the cost of the device process can be reduced. In addition, since the expensive compound semiconductor single crystal substrate can be reused by recovering and repolishing the AlN single crystal substrate or the gallium nitride substrate, the substrate for an ultraviolet ray emission device such as the light-emitting diode for a deep-ultraviolet region can be inexpensively manufactured.

EXAMPLE

Hereinafter, the present invention will be specifically described with Examples, but Examples do not limit the present invention.

Example 1

On a gallium nitride free-standing substrate, a bonding layer composed of $SiO_2$ was grown with 2 μm, and a substrate in which a seed crystal composed of an AlN single crystal was laminated was prepared. A fragile layer was formed in advance by implanting ions from a nitrogen surface of the AlN single crystal, and the seed crystal was bonded and removed to form an AlN single crystal layer with 200 nm in thickness on the bonding layer. Thereafter, a surface of the remained AlN single crystal layer by removal process was polished, and the remained fragile layer was removed to obtain a good seed crystal layer surface. The AlN single crystal after the removal was recovered and repolished to be reused as a substrate for forming a seed crystal layer.

On the laminated substrate obtained as above, AlN was grown with 150 μm by an HVPE method, and the substrate after the growth was taken out. An XRD rocking curve measurement on the AlN-grown substrate demonstrated AlN (0002) 42 arcsec and AlN (10-12) 91 arcsec, which found to obtain a template with good crystallinity.

Then, n-type $Al_{0.95}Ga_{0.05}N$ was grown with 2.5 μm on the template by an MOVPE method. A quantum well structure composed of three barrier layers ($Al_{0.75}Ga_{0.25}N$) and well layers ($Al_{0.6}Ga_{0.4}N$) was formed thereon. Thereafter, a p-type $Al_{0.95}Ga_{0.05}N$ layer and a p-type AlGaN contacting layer were formed. After the p-type AlGaN contacting layer was formed, an inside of the MOVPE furnace was substituted with a nitrogen atmosphere to perform activating annealing at 750° C. for 10 minutes.

Laser irradiation at a wavelength of 308 nm from a side of the p-type AlGaN contacting layer allows the laser to be absorbed on the surface of the gallium nitride free-standing substrate to remove the gallium nitride free-standing substrate from the epitaxial layer, the seed crystal layer, and the bonding layer with generated heat.

The substrate composed of the epitaxial layer, the seed crystal layer, and the bonding layer after the removal of the gallium nitride free-standing substrate was etched with a solution for removing $SiO_2$ and gallium nitride, which were the bonding layer, and Ga residue to obtain an epitaxial substrate suitable for a deep-ultraviolet-emitting diode. The gallium nitride single crystal after the removal was recovered and repolished to be reused as the supporting substrate.

Example 2

A substrate in which a seed crystal composed of an AlN single crystal was laminated onto a gallium nitride (GaN) free-standing substrate with normal-temperature bonding was prepared. That is, a fragile layer was formed by implanting ions from the nitrogen surface of the AlN single crystal, then the surfaces of the AlN single crystal and GaN free-standing substrate were activated by argon-ion etching to form an amorphous layer (bonding layer), bonded by a pressurizing method, and the AlN single crystal was removed with the fragile layer to obtain a laminated substrate. The AlN single crystal after the removal was recovered and repolished to be reused as a substrate for forming a seed crystal layer.

On the above laminated substrate, n-type $Al_{0.95}Ga_{0.05}N$ was grown with 2.5 μm by using the MOVPE method. A quantum well structure composed of three barrier layers ($Al_{0.75}Ga_{0.25}N$) and well layers ($Al_{0.6}Ga_{0.4}N$) was formed thereon. Thereafter, a p-type $Al_{0.95}Ga_{0.05}N$ layer and a p-type AlGaN contacting layer were formed. After the p-type AlGaN contacting layer was formed, an inside of the MOVPE furnace was substituted with a nitrogen atmosphere to perform activating annealing at 750° C. for 10 minutes.

An $SiO_2$ film was formed as the bonding layer on the substrate after the epitaxial growth, and laminated to a sapphire substrate on which an $SiO_2$ film was similarly formed.

Laser irradiation at a wavelength of 308 nm from a back side of the sapphire substrate allowed the laser to be absorbed on the surface of the gallium nitride free-standing substrate to remove the gallium nitride free-standing substrate from the sapphire substrate, the bonding layer, the epitaxial layer, and the seed crystal layer with generated heat, which yielded an epitaxial substrate suitable for a deep-ultraviolet-emitting diode. The gallium nitride single crystal after the removal was recovered and repolished to be reused as the supporting substrate.

Example 3

An epitaxial wafer was produced in the same manner as in Example 2 until the activating annealing. On the p-type AlGaN contacting layer of the wafer, AlGaN was grown with 150 μm by using the HVPE method. The AlGaN layer was produced with the same Al composition as the AlGaN contacting layer in order to achieve lattice match with the p-type AlGaN contacting layer.

Laser irradiation at a wavelength of 308 nm from a side of the p-type AlGaN contacting layer of the substrate allowed the laser to be absorbed on the surface of the gallium nitride free-standing substrate to remove the gallium nitride free-standing substrate from the epitaxial layer, the seed crystal layer, and the bonding layer, which yielded an epitaxial substrate suitable for a deep-ultraviolet-emitting diode. The gallium nitride single crystal after the removal was recovered and repolished to be reused as the supporting substrate.

Comparative Example 1

A sapphire substrate was introduced into a reaction furnace of an MOVPE apparatus, and heated at 1030° C. to perform cleaning for 10 minutes in a state of supplying hydrogen. By introducing gasses to be Al, Ga, and N sources, which were raw materials, at predetermined pressure in the furnace and substrate temperature, a buffer layer for improving crystallinity of an epitaxial layer was growth with 3 μm on the sapphire substrate. As the method from step of growing the first conductive clad layer to step of activating annealing same as the manufacturing method in Example 1, an epitaxial substrate for a light-emitting diode for a deep-ultraviolet region was produced.

Table 1 shows results of XRD rocking curve measurements on the epitaxial substrates for a deep-ultraviolet-emitting diode produced in Examples 1 to 3 and Comparative Example 1. As shown in Table 1, the epitaxial substrates for a deep-ultraviolet-emitting diode of Examples exhibited FWHM of the XRD rocking curve of AlN (0002) of 35 to 60 arcsec, and in contrast, that of Comparative Example exhibited FWHM of 562 arcsec. Examples was able to yield the epitaxial substrate with good crystallinity compared with Comparative Example 1.

TABLE 1

|  | XRD RC AlN (0002) (arcsec) |
| --- | --- |
| Example 1 | 41 |
| Example 2 | 60 |
| Example 3 | 35 |
| Comparative Example 1 | 562 |

Comparative Example 2

An epitaxial substrate for a light-emitting diode for a deep-ultraviolet ray region was produced by producing the removing layer for the laser lift-off with the epitaxial growth. The epitaxial substrate was produced by changing the step of growing the buffer layer in the method of Comparative Example 1 to a method in which low-temperature GaN was grown at 500° C. and then heated to 1100° C. to grow the GaN layer with 100 nm. The epitaxial substrate was taken out from the MOVPE apparatus, and cracking occurred in an entirety of the epitaxial layer. With comparing the threading dislocation density, the method of Example exhibited $3\text{-}7\times10^4$ cm$^{-1}$, in contrast, the method of Comparative Example 2 exhibited $2\times10^8$ cm$^{-1}$, which was considerably increased threading dislocation density.

As described above, the inventive Examples was able to yield the epitaxial substrate with good crystallinity at a low cost.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A method for manufacturing an epitaxial wafer for an ultraviolet ray emission device, the method comprising steps of:
   preparing a supporting substrate having at least one surface composed of gallium nitride;
   forming a bonding layer on the surface composed of the gallium nitride of the supporting substrate;
   forming a laminated substrate having a seed crystal layer by laminating a seed crystal composed of an $Al_xGa_{1-x}N$ ($0.5<x\leq1.0$) single crystal to the bonding layer; and
   epitaxially growing an ultraviolet emission device layer on the seed crystal layer of the laminated substrate, the ultraviolet emission device layer having at least: a first conductive clad layer composed of $Al_yGa_{1-y}N$ ($0.5<y\leq1.0$); an AlGaN-based active layer; and a second conductive clad layer composed of $Al_zGa_{1-z}N$ ($0.5<z\leq1.0$).

2. The method for manufacturing an epitaxial wafer for an ultraviolet ray emission device according to claim 1, wherein in forming the laminated substrate, the seed crystal layer is formed by: implanting ions into an $Al_xGa_{1-x}N$ ($0.5<x\leq1.0$) single crystal free-standing substrate or into an $Al_xGa_{1-x}N$ ($0.5<x\leq1.0$) epitaxial substrate to form a fragile layer inside the free-standing substrate or the epitaxial substrate; then laminating the free-standing substrate or the epitaxial substrate to the supporting substrate; and removing the free-standing substrate or the epitaxial substrate with the fragile layer.

3. The method for manufacturing an epitaxial wafer for an ultraviolet ray emission device according to claim 1, further comprising, before growing the first conductive clad layer, growing an epitaxial layer on the seed crystal layer by an HVPE method.

4. The method for manufacturing an epitaxial wafer for an ultraviolet ray emission device according to claim 2, further comprising, before growing the first conductive clad layer, growing an epitaxial layer on the seed crystal layer by an HVPE method.

5. The method for manufacturing an epitaxial wafer for an ultraviolet ray emission device according to claim 1, further comprising bonding a permanent supporting substrate onto a side of the ultraviolet emission device layer, the permanent supporting substrate being transparent to ultraviolet ray.

6. The method for manufacturing an epitaxial wafer for an ultraviolet ray emission device according to claim 2, further comprising bonding a permanent supporting substrate onto a side of the ultraviolet emission device layer, the permanent supporting substrate being transparent to ultraviolet ray.

7. The method for manufacturing an epitaxial wafer for an ultraviolet ray emission device according to claim 1, further comprising growing an epitaxial layer on a side of the ultraviolet emission device layer by an HVPE method.

8. The method for manufacturing an epitaxial wafer for an ultraviolet ray emission device according to claim 2, further comprising growing an epitaxial layer on a side of the ultraviolet emission device layer by an HVPE method.

9. A method for manufacturing a substrate for an ultraviolet ray emission device, the method comprising a step of removing the supporting substrate to obtain a substrate for an ultraviolet ray emission device by irradiating the epitaxial wafer for an ultraviolet ray emission device obtained by the method for manufacturing an epitaxial wafer for an ultraviolet ray emission device according to claim 1 with laser light to be absorbed by gallium nitride from a side of the ultraviolet emission device layer.

10. An epitaxial wafer for an ultraviolet ray emission device, comprising:
   a laminated substrate having: a supporting substrate having at least one surface composed of gallium nitride; a bonding layer on the surface composed of the gallium nitride of the supporting substrate; and a seed crystal layer composed of an $Al_xGa_{1-x}N$ ($0.5<x\leq1.0$) single crystal on the bonding layer; and
   an ultraviolet emission device layer on the seed crystal layer of the laminated substrate, the ultraviolet emission device layer having at least: a first conductive clad layer composed of $Al_yGa_{1-y}N$ ($0.5<y\leq1.0$); an AlGaN-based active layer; and a second conductive clad layer composed of $Al_zGa_{1-z}N$ ($0.5<z\leq1.0$).

11. The epitaxial wafer for an ultraviolet ray emission device according to claim 10, wherein the supporting substrate is composed of any one of a GaN free-standing substrate, a sapphire substrate having a GaN layer, a SiC substrate having a GaN layer, a Si substrate having a GaN layer, and an engineering substrate having a surface made of a material composed of a GaN single crystal.

12. The epitaxial wafer for an ultraviolet ray emission device according to claim 10, wherein the seed crystal layer has a light transmittance of light having a wavelength of 230 nm of 70% or more.

13. The epitaxial wafer for an ultraviolet ray emission device according to claim 11, wherein the seed crystal layer has a light transmittance of light having a wavelength of 230 nm of 70% or more.

14. The epitaxial wafer for an ultraviolet ray emission device according to claim 10, wherein the AlGaN-based active layer has a multiple quantum well (MQW) structure, contains In as a constituting element other than Al, Ga, and N, and has a proportion of the In of less than 1%.

15. The epitaxial wafer for an ultraviolet ray emission device according to claim 10, wherein the AlGaN-based active layer has $\lambda_p$ being a wavelength shorter than 290 nm, the $\lambda_p$ being in an emission spectrum with current injection at 25° C. and 0.2 A/mm².

16. The epitaxial wafer for an ultraviolet ray emission device according to claim 10, further comprising a permanent supporting substrate on a side of the ultraviolet emission device layer, the permanent supporting substrate being transparent to ultraviolet ray.

17. A substrate for an ultraviolet ray emission device wherein the supporting substrate in the epitaxial wafer for an ultraviolet ray emission device according to claim 10 is separated and removed.

* * * * *